(12) United States Patent
Bacigalupo et al.

(10) Patent No.: US 9,147,448 B2
(45) Date of Patent: Sep. 29, 2015

(54) CIRCUIT ARRANGEMENT AND METHOD FOR OPERATING A CIRCUIT ARRANGEMENT

(71) Applicant: Infineon Technologies AG, Neubiberg (DE)

(72) Inventors: Tommaso Bacigalupo, Fuerstenfeldbruck (DE); Marcus Nuebling, Olching Esting (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 379 days.

(21) Appl. No.: 13/834,422

(22) Filed: Mar. 15, 2013

(65) Prior Publication Data

US 2014/0269126 A1    Sep. 18, 2014

(51) Int. Cl.
*G11C 7/00* (2006.01)
*G11C 7/12* (2006.01)
*G06F 3/05* (2006.01)
*G11C 27/02* (2006.01)
*G11C 11/412* (2006.01)

(52) U.S. Cl.
CPC .. *G11C 7/12* (2013.01); *G06F 3/05* (2013.01); *G11C 27/02* (2013.01); *G11C 11/412* (2013.01)

(58) Field of Classification Search
CPC ........ G11C 11/412; G11C 11/56; G11C 7/08; G11C 7/12; G11C 7/22; H01L 27/1104

USPC .......................................... 365/203, 154, 156
See application file for complete search history.

(56) References Cited

U.S. PATENT DOCUMENTS 6,992,915 B2 * 1/2006 Kang et al. .................... 365/154

OTHER PUBLICATIONS

David Kinniment, University of Newcastle, UK "Synchronizers, Arbiters, GALS and Metastability" TUBS Jul. 1, 2009, p. 1-58.
Jens Sparsø, Technical University of Denmark, "Asynchronous Circuit Design, A Tutorial", 2006, p. 1-182.

* cited by examiner

*Primary Examiner* — David Lam

(57) ABSTRACT

A circuit arrangement is provided, including a storage circuit and an output circuit. The storage circuit is configured to provide a first output signal and a second output signal. The output circuit is configured to receive the first output signal and the second output signal and configured to provide an output signal having one of a first signal level and a second signal level, and to only switch from the first signal level to the second signal level if the difference between the first output signal and the second output signal exceeds a threshold. The circuit arrangement is configured to hold the first output signal and the second output signal independent of a difference between the first output signal and the second output signal after the switching has been carried out.

21 Claims, 4 Drawing Sheets

CIRCUIT ARRANGEMENT AND METHOD FOR OPERATING A CIRCUIT ARRANGEMENT

TECHNICAL FIELD

Various embodiments relate generally to circuit arrangements and methods for operating a circuit arrangement.

BACKGROUND

An input of a circuit may for example be derived from an analog sensor signal. The analog sensor may indicate the occurrence of an event, for example, that a current has crossed a threshold. The occurrence of the event may be stored in a memory element and may be further processed afterwards. Such a circuit may be called an event catcher.

However, the shape and the timing of the signal at the input of the circuit may be uncertain. It is therefore possible that the timing conditions such as the setup time, hold time, minimum pulse width, etc. of the memory element may be violated and that the occurrence of an event is not recorded properly.

If the timing conditions of a memory element are violated it may stay in a metastable state for an uncertain time before it will toggle into one of its stable states. The stable state into which the memory element will toggle is also unpredictable. A metastable state may propagate to other parts of the circuit and may result in undefined behavior. As an example, this may occur in mixed-signal processing, where outputs of analog components are processed by a clocked digital logic and where the control logic of the analog components is not synchronized with the signal clock of the digital logic.

SUMMARY

In various embodiments, a circuit arrangement is provided, including a storage circuit configured to provide a first output signal and a second output signal; an output circuit configured to receive the first output signal and the second output signal and configured to provide an output signal having one of a first signal level and a second signal level, and to only switch from the first signal level to the second signal level if the difference between the first output signal and the second output signal exceeds a threshold. The circuit arrangement is configured to hold the first output signal and the second output signal independent of a difference between the first output signal and the second output signal after the switching has been carried out.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the drawings, the left-most digit(s) of a reference number can identify the drawing in which the reference number first appears. The same numbers can be used throughout the drawings to reference like features and components. In the following description, various embodiments of the invention are described with reference to the following drawings, in which.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

Figure 1:
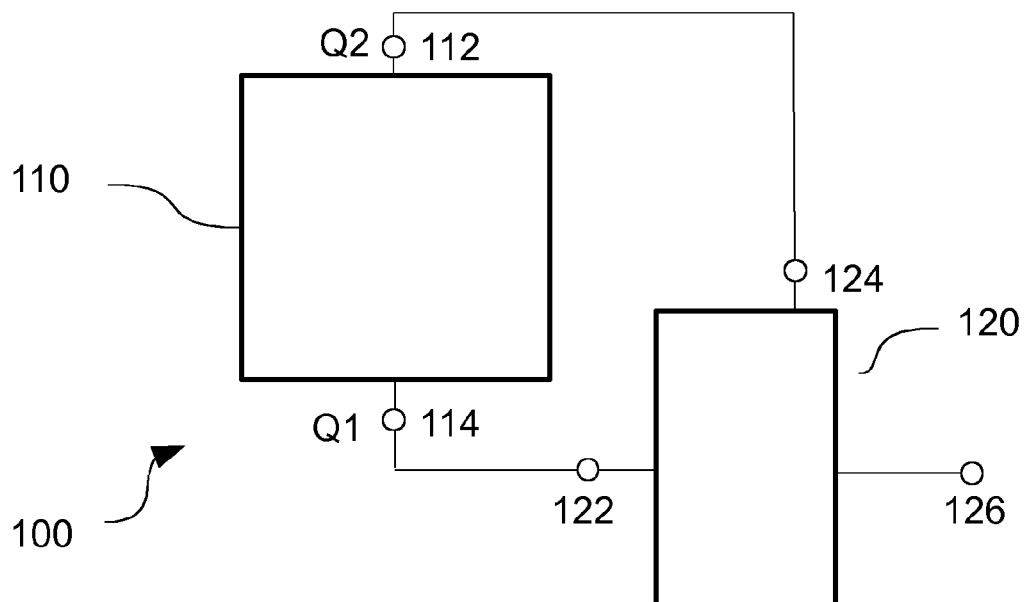
FIG. 1 shows a circuit arrangement in accordance with various embodiments.

FIG. 1 shows a circuit arrangement 100 in accordance with various embodiments having a storage circuit 110 and an output circuit 120.

The storage circuit 110, which may also be called a storage element or a memory element, may have a first output 114, which may also be called a first node, which may output a first output signal Q1, and may have a second output 112, which may also be called a second node, which may output a second output signal Q2. The first node 114 and the second node 112 of the storage circuit 110 may be regarded as inputs or as outputs. If the state of the storage circuit 110, that is the states of the first output signal Q1 and the second output signal Q2, is to be changed or written by applying one or more potentials, the first node 114 and the second node 112 may be regarded as inputs. If the state of the storage circuit 110 is to be determined or read, the first node 114 and the second node 112 may be regarded as outputs.

The storage circuit 110 may be configured to operate in a first state S1, a second state S2 or a metastable state M. The first state S1 and the second state S2 may be stable. The storage circuit 110 may be configured to provide a first state output signal, a second state output signal or a metastable state output signal at the output 112, 114. The first state output signal may be output, when the storage element 110 is in the first state S1. The second state output signal may be output, when the storage element 110 is in the second state S2. In the first state S1 and the second state S2, the second output signal Q2 may be logically inverse to the first output signal Q1. For example, the first output signal Q1 can be logic high and the second output signal Q2 may be logic low, and vice versa. The metastable state output signal may be output, when the storage element 110 is in the metastable state M. In the metastable state M, the first output signal Q1 and the second output signal Q2 may be at levels between logic low and logic high. The first output signal Q1 and the second output signal Q2 may in this case be at different potentials or both be at the same potential, for example at VDD/2, where VDD may be a supply potential of the circuit arrangement. The metastable state M may not be stable against small disturbances and the storage circuit 110 will toggle into the first state S1 or into the second state S2 after an uncertain time period. When transferring from the first state S1 to the second state S2, and vice versa, the metastable state M is also passed. However, if the driving strength of the signals that cause the storage circuit 110 to toggle its state is large enough, it will stay in the metastable state M only for a very short time.

Figure 4:
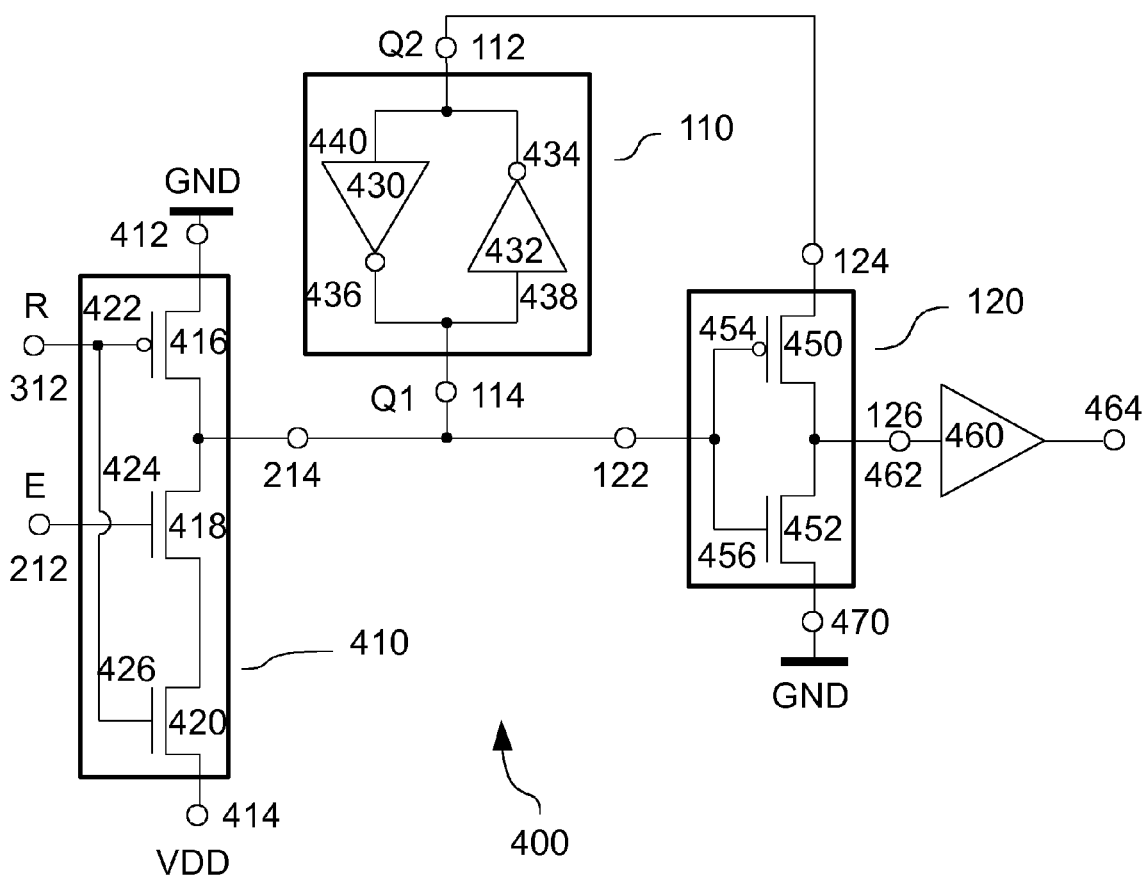
FIG. 4 shows a circuit arrangement in accordance with various embodiments.

The storage circuit 110 may be implemented in different ways and further details are given in conjunction with the description of FIG. 4. The storage circuit 110 may be used to capture, or, in other words, to store, the occurrence of an event.

The output circuit or filter circuit 120 may have an input 122, 124 and an output 126. The input 122, 124 of the output circuit 120 may be coupled to the output 114, 112 of the storage circuit 110. The input 122, 124 of the output circuit 120 may have a first input 122 coupled to the first output 114 of the storage circuit 110 and a second input 124 coupled to the second output 112 of the storage circuit 110.

The output circuit 120 may be configured to receive the first output signal Q1 and the second output signal Q2. It may be configured to provide an output signal having one of a first signal level and a second signal level. The output circuit 120 may be configured to only switch from the first signal level to the second signal level if the difference between the first output signal Q1 and the second output signal Q2 exceeds a threshold. The circuit arrangement 100 may be configured to hold the first output signal and the second output signal independent of a difference between the first output signal Q1 and the second output signal Q2 after the switching has been carried out. In this way, the circuit arrangement 100 may capture the occurrence of an event. Further, a propagation of the metastable state output signal M from the input 122, 124 of the output circuit 120 to the output 126 of the output circuit 120 is suppressed. In other words, the output circuit 120 may be configured to reduce the metastable state output signal from the input 122, 124 of the output circuit 120 to the output 126 of the output circuit 120. The metastable state M will be filtered or blocked by the output circuit 120 and will not be propagated to its output 126.

Figure 2:
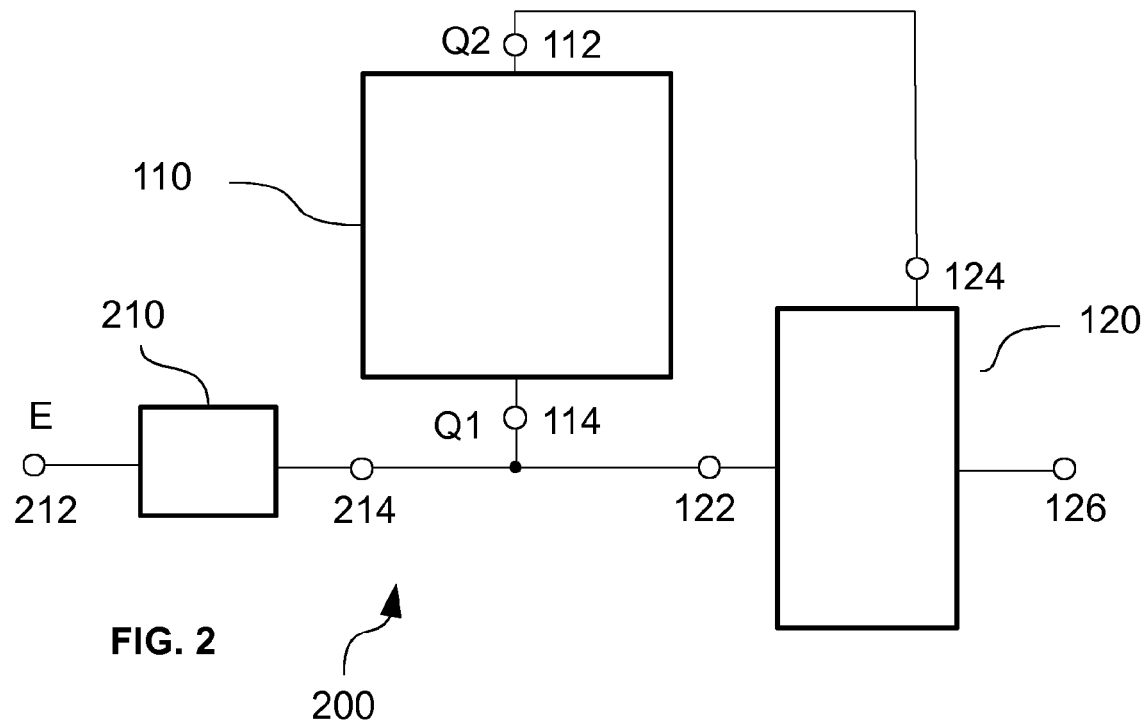
FIG. 2 shows a circuit arrangement in accordance with various embodiments.

FIG. 2 shows a circuit arrangement 200 in accordance with various embodiments having a storage circuit 110, an output circuit 120 and an input circuit 210. The input circuit 210 may be coupled to the input 114 of the storage element 110. The input circuit 210 may have a control input 212, which may also be called a second input, to receive a control signal E, which may also be called a second signal. The control signal E may indicate the occurrence of an event and may be provided by a sensor, for example an analog sensor, or by a circuit, such as a measurement circuit. The sensor may be used to detect the occurrence of an event, for example, of a current or a voltage exceeding a predetermined threshold. The circuit 210 may be configured to control the storage circuit 110 to transfer from the first state S1 into the second state S2 dependent on the control signal E.

Figure 3:
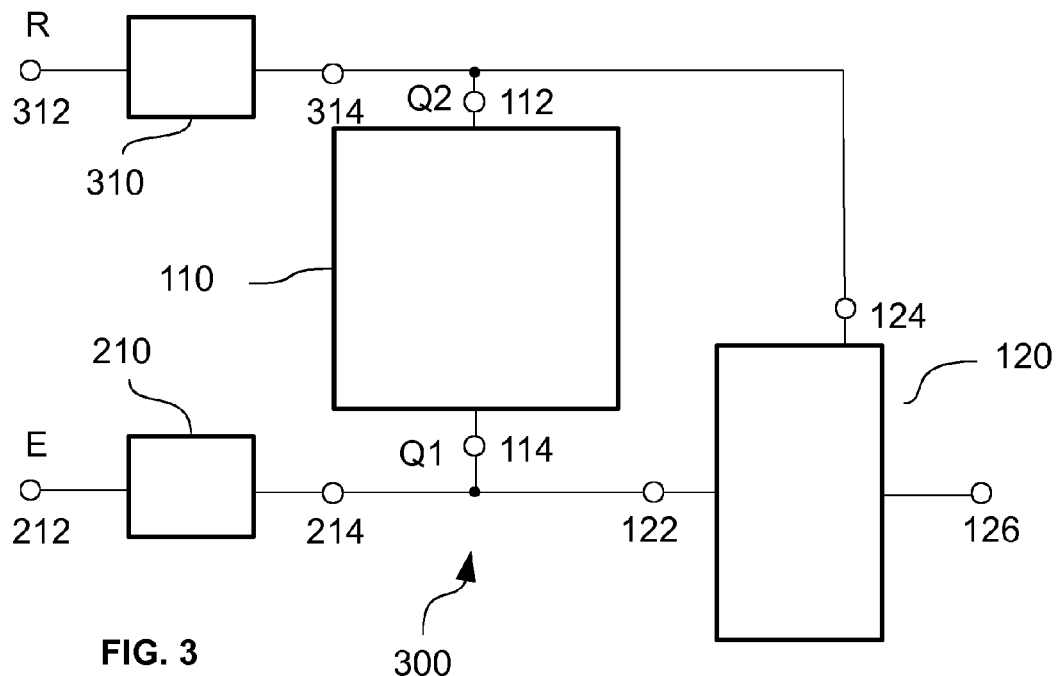
FIG. 3 shows a circuit arrangement in accordance with various embodiments.

FIG. 3 shows a circuit arrangement 200 in accordance with various embodiments having a storage circuit 110, an output circuit 120, an input circuit 210 and another input circuit 312. The circuit 310 may have a reset input 312, which may also be referred to as a first input, to receive a reset signal R, which may also be referred to as a first signal or a precharge signal. The reset signal R may be provided by the sensor or another circuit which provides the control signal E or by a separate circuit.

The input circuit 210 may be configured to control the storage circuit 110 to transfer from the first state S1 into the second state S2 dependent on the control signal E. The other input circuit 310 may be configured to control the storage circuit 110 to transfer from the second state S2 into the first state S1 dependent on the reset signal R. The reset signal R and the control signal E may need to be controlled together so that no contradicting information is applied to the storage element 110. For example, Q1 and Q2 may have logically inverse values.

For operating the circuit arrangement shown in FIGS. 1 to 3, the storage circuit 110 only requires two nodes, the first node 114 and the second node 112. It does not need further inputs, such as a reset input or a set input, to transfer it into from the first state S1 to the second state S2, and vice versa. Instead, the storage circuit 110 may change from the first state S1 to the second state S2, and vice versa, by applying a signal to the first node 114 or to the second node 112 or by applying signals to both the first node 114 and the second node 112. The operation of the storage circuit 110 may be considered to be similar to the operation of a static random access memory, SRAM. In contrast to an SRAM memory cell, however, no access or selection transistors are needed or provided in various embodiments.

FIG. 4 shows a circuit arrangement 100 in accordance with various embodiments having a storage circuit 110, an input circuit 410 and an output circuit 120.

The storage circuit 110 may have a plurality of cross-coupled inverters 430, 430. It may have a first inverter 432 with an input 438 and an output 434 and a second inverter 430 with an input 440 and an output 436. The input 438 of the first inverter 432 and the output 436 of the second inverter 430 may be coupled to the first node 114 and the input 440 of the second inverter 430 and the output 434 of the first inverter 432 may be coupled to the second node 112. The inverters 430, 432 may each have a NAND gate with two inputs, where the two inputs have been coupled together. However, any other implementation of an inverter may be provided in alternative embodiments. The inverters 430, 432 may each have two transistors connected in series, where the transistors have opposite polarities and an input of each of the inverters 430, 432 may be connected to the control gates of the transistors and an output of each of the inverters may be provided at the point of coupling between the transistors. One of the transistors may be a PMOS transistor (p-channel metal oxide semiconductor transistor) and the other transistor may be an NMOS transistor (n-channel metal oxide semiconductor transistor). The inverter 430, 432 may be implemented in CMOS (complementary metal oxide semiconductor) technology.

The first inverter 432 may have a greater driving strength than the second inverter 430. The second inverter 430 may set the voltage or potential at the first node 114. If the driving strength of the second inverter 430 is too high, it may overwrite or oppose a potential that the input circuit 410 tries to apply to the first node 114 via its output 214.

The input circuit 410 may be a combination of the first input circuit 210 and the second input circuit 310 shown in FIG. 3. It may be coupled to the input 114 of the storage element 110. The input circuit 410 may have a control input 212, which may also be called a second input, to receive a control signal E, which may also be called a second signal. The control signal E may indicate the occurrence of an event and may be provided by a sensor, for example an analog sensor, or a circuit, such as a measurement circuit. The sensor may be used to detect the occurrence of an event, for example, of a current or a voltage exceeding a predetermined threshold. The circuit 410 may further have a reset input 312, which may also be referred to as a first input, to receive a reset signal R, which may also be referred to as a first signal or a precharge signal. The reset signal R may be provided by the sensor or another circuit which provides the control signal E or by a separate circuit.

The input circuit 410 may be configured to control the storage circuit 110 to transfer from the first state S1 into the second state S2 dependent on the control signal E, and to transfer from the second state S2 into the first state S1 dependent on the reset signal R. The reset signal R may be dominant over the control signal E. Alternatively, the control signal E may be dominant over the reset signal R.

In other words, the input circuit 410 may be configured to operate the storage circuit 110 to change between the first state S1 and the second state S2 dependent on the first signal R and the second signal E, where the first signal R overrules the second signal E. Alternatively, the second signal E overrules the first signal R.

In still other words, the reset signal R may determine the state of the storage circuit 110 irrespective of the state of the control signal E, and the control signal E determines the state of the storage circuit 110 only if the reset signal R is in a predefined state. Alternatively, the control signal E may determine the state of the storage circuit 110 irrespective of the state of the reset signal R, and the reset signal R determines the state of the storage circuit 110 only if the control signal E is in a predefined state.

In still other words, the input circuit 410 may be configured to output a signal Q1 with a first state (or, alternatively, a logically inverted first state), irrespective of the state of the second signal E, when the first signal R is in a first state, and to output a signal Q1 with a state (or, alternatively, a logically inverted state) of the second signal E if the first signal R is in a second state.

If the first signal R is in a first state, for example in a logic low state, e.g. logic "0", the input circuit 410 may have at its output 108 a logic low state, e.g. logic "0", irrespective of the state of the second signal E which may be at a logic high level or logic low level. The first signal R overwrites or dominates the second signal E in the sense that the state of the second signal E does not influence the output of the input circuit 410. The first node 132 may then be precharged to a predetermined state of logic "0" by the first signal R. The storage circuit 113 and the circuit arrangement 100 may be set to a predetermined stable state S1.

If the first signal R is in a second state, which may be a state logically inverted to the first state, and may be a logic high state, e.g. logic "1", the circuit arrangement 100 is armed, that is, it is ready to capture inputs of the second signal E. The input circuit 410 may have at its output the logically inverted state of the second signal E. The state of the second signal E may be passed through the input circuit 410 and the occurrence of an event represented by the second signal E can be further processed and be stored in the storage element 130.

The input circuit 410 may have an output 214. The input circuit 410 may be configured to provide a first signal T1, which may also be referred to as a first storage element input signal, at the output 214 dependent on the received control signal E, and to provide a second signal T2, which may also be referred to as a second storage element input signal, at the output 214 dependent on the reset signal R, and independent from the control signal E. Alternatively, the input circuit 410 may be configured to provide a first signal T1, which may also be referred to as a first storage element input signal, at the output 214 dependent on the reset signal R, and to provide a second signal T2 which may also be called a second storage element input signal, at the output 214 dependent on the control signal E, and independent from the reset signal R.

The input circuit 410 may have a first switching element 416 of a first conductivity type and a second switching element 418 of a second conductivity type and a third switching element 420 of the second conductivity type coupled in series between a first power node 412 and a second power node 414. The second switching element 418 may be coupled in between the first switching element 416 and the third switching element 420. The second input or control input 212 may be coupled to a control input 424 of the second switching element 418 and the first input or reset input 312 may be coupled to a control input 422 of the first switching element 416 and to a control input 426 of the third switching element 420.

The first switching element 416 may have a first transistor of the first conductivity type. The second switching element 418 may have a second transistor of the second conductivity type. The third switching element 420 may have a third transistor of the second conductivity type. The first conductivity type may be a p-conductivity type. The second conductivity type may be an n-conductivity type. The transistors may be field effect transistors (FETs).

The voltage level of a first voltage V1 received by the first power node 412 may be lower than the voltage level of a second voltage V2 received by the second power node 414. The first voltage V1 may be a ground voltage GND and the second voltage V2 may be a VDD voltage. The input circuit 410 may provide the function of a AND gate with inputs 212, 312 and output 214.

The output circuit 120 may include a fourth switching element 450 of the first conductivity type and a fifth switching element 452 of the second conductivity type coupled in series between the second output 112 of the storage circuit 110 and a second supply connection 470, which may be the second supply power node and which may be at ground potential GND. The output 126 of the output circuit 120 may be provided at the point of coupling of the fourth switching element 450 and the fifth switching element 452. A control input 454 of the fourth switching element 450 and a control input 456 of the fifth switching element 452 may both be coupled to the first output 114 of the storage circuit 110. The fourth switching element 450 may have a fourth transistor of the first conductivity type. The fifth switching element 452 may have a fifth transistor of the second conductivity type.

The output circuit 120 may be an inverter having an input 122, an output 126 and a first supply voltage connection 124. The first supply voltage connection 124 may also be referred to as an input of the filter or output circuit, a second input of the filter or output circuit or a supply input. The input 122 may be coupled to the first node 114 of the storage element 110 and the first supply voltage connection 124 may be coupled to the second node 112 of the storage element 110. The inverter may have a transistor 450 of a first polarity (or conductivity type) and a transistor 452 of a polarity (or conductivity type) opposite to the first polarity (or conductivity type). The transistors 450, 452 may be coupled in series between the first supply voltage connection 124 and a second supply voltage connection 470. The second supply voltage connection 470 may also be referred to as a reference potential and may be a ground potential GND. The control inputs 454, 456 of the transistors 450, 452 may be coupled to the first node 114 of the storage element 110. A point, at which the transistors 450, 452 are coupled to each other, may be configured as the output 126 of the inverter. The transistors may be field effect transistors (FETs). The output circuit 120 may be a static CMOS inverter, an NMOS inverter, a PMOS inverter or a bipolar inverter.

The circuit arrangement may have two different types of operation, depending on whether a transition is made from Q1="1" to Q1="0", in the following also referred to as a first transition, or from Q1="0" to Q1="1", in the following also referred to as a second transition.

In the first transition, the first output signal Q1 of the storage circuit 110 is changed from Q1="1" to Q1="0".

Before the transition takes place, Q1="1", and Q2, having the logically inverted value of Q1, is Q2="0". Q1="1" is applied to the control inputs 454 and 456 of the fourth switching element 450 and the fifth switching element 452, respectively. Q2="0" is applied to the second input 124 of the output circuit 120. If Q2="1" was applied to the second input 124 of the filter circuit 120, the fourth switching element 450, being a PMOS-FET, would not be electrically conductive. The fifth switching element 452 would be electrically conductive and connect the output 126 of the output circuit 120 to the second supply connection 470 of the output circuit 120, which is at a ground potential. However, with Q2="0", the output circuit 120 is not powered and the circuit arrangement has at its output 126 a logic low potential, e.g. logic "0".

The input circuit 410 may apply a first signal T1 having the opposite logic value to Q1="1", namely Q1="0", to the first node 114 in order to toggle the state of the storage circuit 110. The first signal T1 causes the potential Q1 of the first node 114 to decrease. The only opposition to the change in the potential Q1 is given by the storage circuit 110 by the value that is stored in it as no potential is applied to the second node 112 by the output circuit 120 to keep it at the original value Q2="0". The potential Q1 of the first node 114 will decrease and will reach a potential, for example VDD/2, that the first node 114 has when the storage circuit 110 is in a metastable state M. With the decrease of the potential Q1, the potential Q2 will increase, for example to VDD/2, due to the inverter 432, and the output circuit 120 will be supplied with a potential of VDD/2 at the second input 124.

If the first signal T1 is applied long enough with a high enough driving strength, the storage circuit 110 will toggle from Q1="1" to Q1="0" and from Q2="0" to Q2="1". Q1="0" is then applied to the control inputs 454 and 456 of the fourth switching element 450 and the fifth switching element 452, respectively. Q2="1" is applied to the second input 124 of the output circuit 120. The output circuit 120 is powered and the fifth switching element 452 is turned off. The fourth switching element 450, being a PMOS-FET, would be electrically conductive and connects the output 126 of the output circuit 120 to the first supply connection 124 of the output circuit 120 and to the logic high value of Q2="1", which may be, for example, VDD. The circuit arrangement has at its output 126 a logic high potential, e.g. "1".

During the first transition, the time that the storage circuit 110 stays in a metastable state may be reduced by applying a first signal T1 that will result in a fast transfer, for example by having a high driving strength and by being applied long enough. The first signal T1 may for example be a well defined reset signal R.

In the second transition, the first output signal Q1 of the storage circuit 110 changes from Q1="0" to Q1="1". Before the transition takes place, Q1="0" and Q2, having the logically inverted value of Q1, is Q2="1". Q1="0" is applied to the control inputs 454 and 456 of the fourth switching element 450 and the fifth switching element 452, respectively. Q2="1" is applied to the first input connection 124 of the output circuit 120 and powers it. The fourth switching element 450, being a PMOS-FET, would be electrically conductive and connects the output 126 of the output circuit 120 to the first supply connection 124 of the output circuit 120 at the potential of Q2="1", for example, VDD. The fifth switching element 452 is disabled.

The input circuit 410 may apply a second signal T2 having the opposite logic value to Q1="0", namely logic "1", to the first node 114, in order to toggle the state of the storage circuit 110. The second signal T2 causes the potential Q1 of the first node 114 to increase to a value that the first node 114 has when the storage circuit 110 is in a metastable state M, for example VDD/2. With the increase of the potential Q1, the potential Q2 will decrease, for example to the VDD/2, due to the inverter 432. The output circuit 120 will be supplied with a potential of VDD/2 at the first supply connection 124.

In contrast to the stable states, in which only one of the fourth switching element 450 and fifth switching element 452 conducts, both the fourth switching elements 450 and the fifth switching element 452 may conduct in a non-stable state. As a result, the second node 112 is pulled down to ground potential at the second supply connection 470. Therefore, in addition to the second signal T2, which tries to toggle the state of the storage element 110 by means of the first node 114, the output circuit 120 helps in toggling the state of the storage element 110 from logic "0" to logic "1" by pulling the potential of the second node 112 down. Toggling the state of the storage circuit 110 is thus accelerated by the filter circuit 120. In an analogy to everyday life, the task of turning off a room light is achieved not only by activating the light switch but also by reducing the power supply of the room light at the same time.

During the second transition, the time that the storage circuit 110 stays in a metastable state may be reduced by using the output circuit 120 to help change the state of the storage circuit 110 by acting on the second node 112 at the same time and in the same direction that the second signal T2 tries to toggle the storage circuit 110. The second signal T2 may therefore be a signal which does not need to be well defined in terms of driving strength and duration. The second signal T2 may for example be a signal derived from an analog circuit, for example a circuit with a sensor for detecting the occurrence of an event E or from an asynchronous circuit. The second signal T2 is passed through input circuit 410 and does not need to fulfill any timing specifications in order to avoid metastability. The circuit arrangement may be configured such that a metastable state in the storage element 110 caused by a weak or undefined second signal T2 is accelerated out the metastable state and the time in the metastable state is shortened. The occurrence of an event E that causes the second signal T2 may be stored in the storage circuit 110 for further evaluation.

In both the first transition and the second transition, the time that the storage circuit 110 stays in a metastable state may be reduced, so that the likelihood of a propagation of the metastable state is significantly reduced.

The circuit arrangement 100 may have a load circuit 460 coupled to the output 126 of the output circuit 120. The load circuit 460 may be used to indicate if an event E has occurred. The load circuit 460 may have at least one of a buffer circuit and an inverter. The output of the load circuit 460 may provide only output values of e.g. 0 V and VDD, so that it is impossible to propagate a metastable state. The predefined threshold may be half the difference between the first voltage V1 and the second voltage V2. The predefined threshold may be VDD/2. The predefined threshold may be half the difference between the voltage of the second output signal Q2 at the second node 112 of the storage element 110 and the voltage of the second supply connection 470.

In the metastable state M, the first output signal Q1 and the second output signal Q2 may each have a potential of VDD/2. The output 126 of the output circuit 120 is the output of a voltage divider formed by the fourth switching element 450 and the fifth switching element 452. If the voltage drop across the fourth switching element 450 and the fifth switching element 452 is equal, a voltage of VDD/4 will appear when the storage element 110 is in a metastable state M. The load circuit 460 may be configured to output a voltage when the voltage at the output 126 of the output circuit 120 is greater or less than the predefined threshold of VDD/4.

If the first output signal Q1 and the second output signal Q2 are not at the same potential in the metastable state, for example, when the inverters 430 and 432 differ from each other, and if the fourth switching element 450 and the fifth switching element 452 have the same voltage drop across them, the output circuit 460 may be configured to output a voltage when the voltage at the output 126 of the output circuit 120 is greater or less than half the potential at the second node 112.

Acceleration out of a metastable state may be possible if there is a voltage difference between the first supply connection 156 and the second supply connection 470, for example if they have opposite logical values. In this case, the output circuit 120 is powered and can help in toggling the state of the storage element 110 by applying a supporting potential at the second node 112. For example, the first supply connection 124 could be at logic "0" and the second supply connection 470 could be at logic "1", or VDD. Then Q2 would be Q2="0" and Q1 would be precharged to Q1="1". Q1 could be precharged to Q1="1" by the reset signal R, if the first power node 412 is connected to VDD and the second power node 414 is connected to GND. Acceleration out of a metastable state may be useful for weak signals, that is, signals of unknown amplitude and duration, for example sensor signals or signals indicating the occurrence of an event.

The circuit arrangement 100 may be configured as an edge catching circuit arrangement. It may be configured as an interface between an asynchronous circuit arrangement and a synchronous circuit arrangement. The propagation of the metastable state may be suppressed. There is no need to use an analog filter so that fast events E can be captured.

Figure 5:
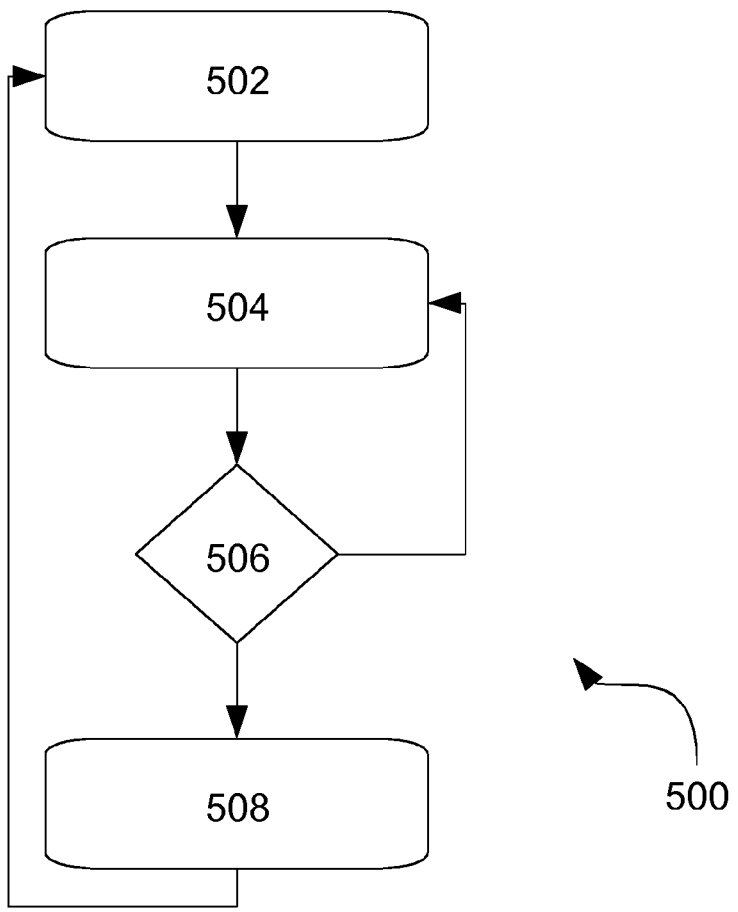
FIG. 5 shows a method in accordance with various embodiments for operating a circuit arrangement.

FIG. 5 shows a method 500 in accordance with various embodiments for operating a circuit arrangement.

In 502 of the method 500, the first node 114 of the storage circuit 110 may be precharged to the first state S1. The first node 114 of the storage element 110 may be coupled to an input 122 of a filter or output circuit 120. The second node 112 of the storage element 110 may be coupled to a supply input 124 of the filter circuit 120. The second node 124 may have a potential that differs from the potential at another supply input 470 of the filter circuit 120. For example, the potentials may be at opposite logic values, e.g. "0" and "1" or at 0 Volt and VDD Volt. As a result, the output circuit 120 is powered. The first node 114 of the storage element 110 may be precharged to the first state S1 by a first signal T1, which may be provided by input circuit 410 when a reset signal R or precharge signal is applied to the first input or reset input 312 of the circuit 410.

In 504, a second signal T2 may be applied to the first node 114 of the storage element 110. The second signal T2 may have a polarity opposite to the polarity of the potential Q1 in the first state S1. If the potential Q1 in the first state S1 is logic high or e.g. logic "1", the second signal T2 may be logic low, or e.g. logic "0". The second signal T2 may be provided by input circuit 410 when a control signal or event signal E, which may represent the occurrence of an event, is applied at the second input 212.

In 506, it may be determined if applying the second signal T2 operates the storage element 110 to change from the first state S1 to the second state S2. If the storage element 110 does not change from the first state S1 to the second state S2, the flow may return to 504. The circuit arrangement may remain in the precharged state and may wait for other second signals T2 strong enough to toggle the storage element 110. If the storage element 110 changes from the first state S1 to the second state S2, the flow may continue with 508. The second state be may a capture state or an event notifier state which indicates that an event has occurred.

In 508, an output signal may be provided if a signal at an output of the inverter or output circuit 120 crosses a predefined threshold. The output signal may be processed by another circuit, for example a clocked or synchronous circuit. The flow may return to 502 where the first node 114 of the storage element 110 is again precharged to the first state S1 after the storage element 110 may have changed to the second state S2 or the metastable state M and after the output signal may have be processed.

Figure 6:
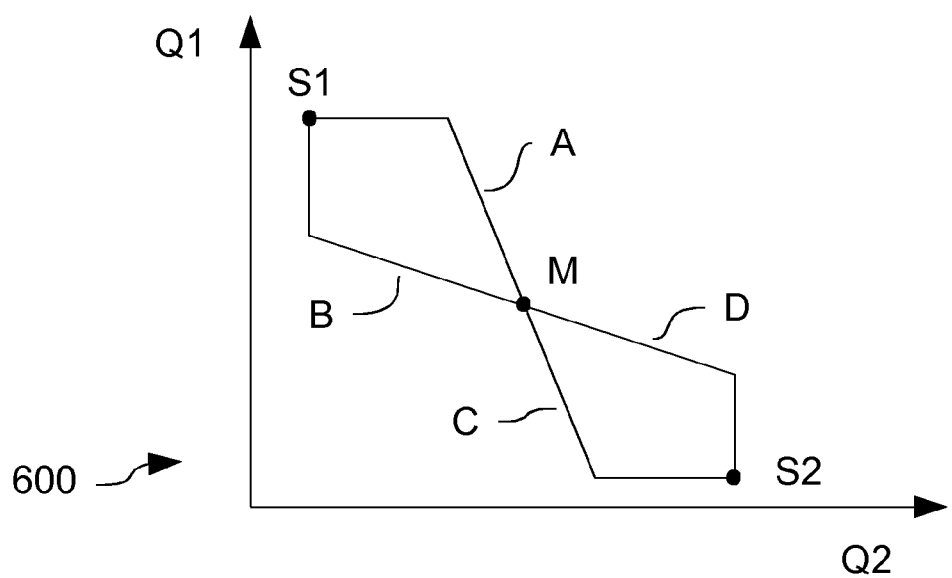
FIG. 6 shows transitions of a memory element circuit in accordance with various embodiments.

FIG. 6 shows transitions 600 of a memory element 110 in accordance with various embodiments. Shown are values of the first output signal Q1 over values of the second output signal Q2. In the first state S1, the first output signal Q1 may have a high or large value and the second output signal Q2 may have a low or small value. In the second state S2, the first output signal Q1 may have a low or small value and the second output signal Q2 may have a high or large value. The values may be electrical potentials. In the first state S1, Q1=1, Q2=0, and in the second state S2, Q1=0, Q2=1.

When in the first state S1, the value of the second output signal Q2 may be increased, for example by applying a signal with a high potential to the second node 112, for example by the another input circuit 312. The first output signal Q1 remains constant until the second inverter 430 causes it to decrease. The path of the first output signal Q1 and the second output signal Q2 is indicated by A. The first output signal Q1 may continue to decrease and the second output signal Q2 may continue to increase until the influence of the first inverter 432 and the second inverter 430 is equal and a metastable state M is reached. Depending on circumstances, the first output signal Q1 and the second output signal Q2 may return to the first state S1 via path B or may continue to the second state S2 via path C. The first output signal Q1 may continue to decrease until it reaches a low potential at which it may stay constant while the second output signal Q2 continues to increase to a high potential and the second state S2 is reached.

When in the second state S2, the value of the first output signal Q1 may be increased, for example by applying a signal with a high potential to the first node 114, for example by the input circuit 214. The second output signal Q2 remains constant until the first inverter 432 causes it to decrease. The path of the first output signal Q1 and the second output signal Q2 is indicated by D. The second output signal Q2 may continue to decrease and the first output signal Q1 may continue to increase until the influence of the first inverter 432 and the second inverter 430 is equal and the metastable state M is reached. Depending on circumstances, the first output signal Q1 and the second output signal Q2 may return to the second state S2 via path C or may continue to the first state S1 via path B. The second output signal Q2 may continue to decrease until it reaches a low potential at which it may stay constant while the first output signal Q1 continues to increase to a high potential and the first state S1 is reached.

In embodiments of the circuit arrangement the uncertainty about which path is taken when the metastable state M is reached may be eliminated. Path A may continue only with path C once the metastable state M has been crossed. Path D may continue only with path B once the metastable state M has been crossed.

Figure 7:
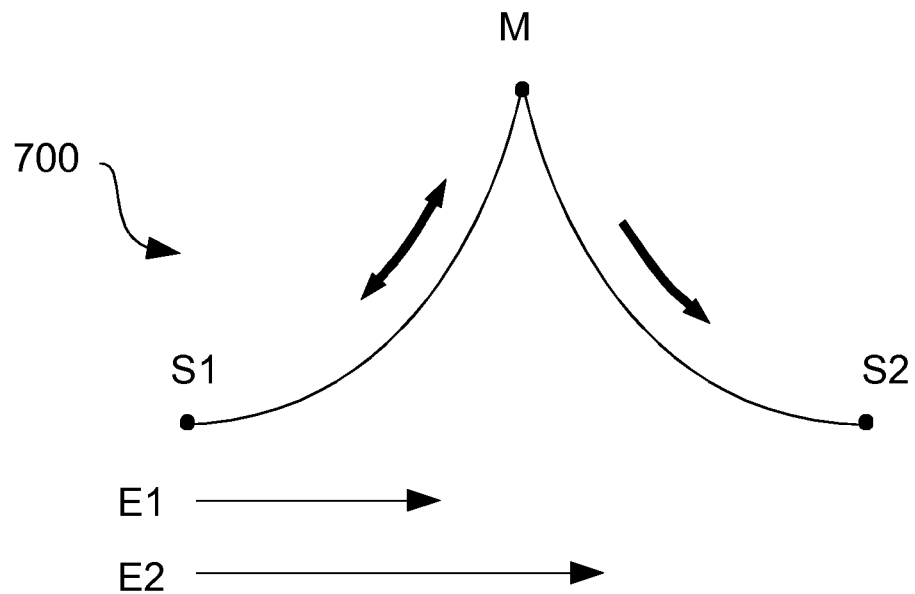
FIG. 7 shows a transition in a circuit arrangement in accordance with various embodiments.

FIG. 7 shows a transition 700 in a circuit arrangement in accordance with various embodiments shifting from a first state S1 to a second state S2. The first state S1, the metastable state M and the second state S2 are represented as dots and are connected by a line. The metastable state M lies between the first state S1 and the second state S2.

The operation of the circuit arrangement is illustrated with the help of analogy to gravity. The first state S1 and the second state S2 are stable states. A ball placed at the first state S1 or the second state S2 will not be moved by gravity. A ball placed at M is metastable. It will stay at M until it is disturbed. Depending on the direction of the disturbance, gravity will pull the ball along the line either to S1 or S2. If a ball has enough energy when moving from S1 to S2, and vice versa, it will pass through the metastable state M quickly and not stop there. However, if a ball has just enough energy to reach M, it may stop there for an uncertain time.

The ball is first placed at S1. The first node 114 of the circuit arrangement has been precharged by a reset signal R. The circuit arrangement is armed and ready to detect events. A first event E1 has enough energy to move the ball upward, in the direction of M. However, its energy is not enough and the ball does not yet reach M. The ball returns to S1. The movement between S1, M and S1 is illustrated by the double headed arrow. The storage circuit 110 will not be toggled from the first state S1 to the second state S2 by the first event E1.

A second event E2 has enough energy, so that the ball reaches M. The storage circuit 110 is in a metastable state M. The circuit arrangement is designed so that once the ball reaches M, it can only move towards S2 and will not move back to S1. The movement between M and S2 is one-way, from M to S2, as is illustrated by the single headed arrow. The ball will then stay at S2 and not cross M again, regardless of any further events that are applied to the ball. Diagram 700 may illustrate the second transition of the circuit arrangement.

Figure 8:
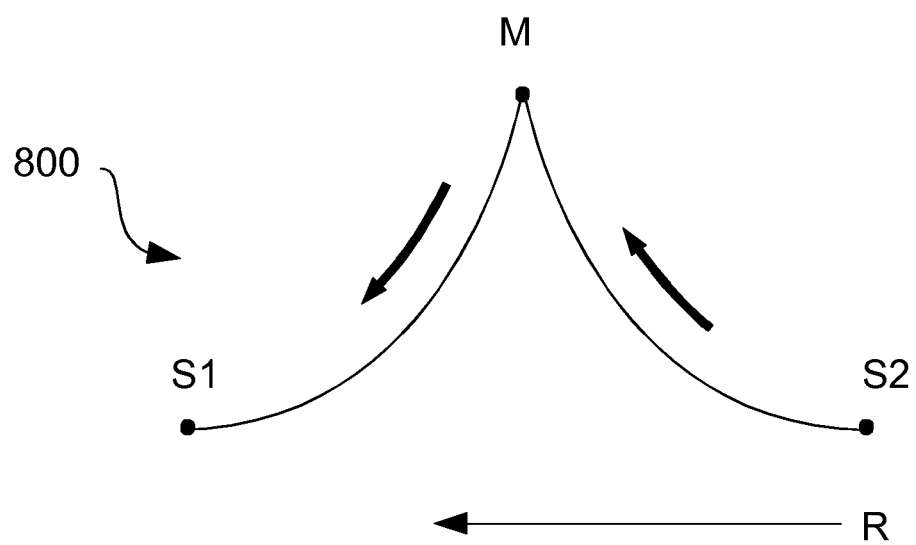
FIG. 8 shows a transition in a circuit arrangement in accordance with various embodiments.

FIG. 8 shows a transition 800 in a circuit arrangement in accordance with various embodiments shifting from a second state S2 to a first state S1. As with FIG. 7, the operation of the circuit arrangement is illustrated with the help of analogy to gravity, so that the same considerations apply.

The ball has been placed at the second state S2 by the occurrence of a second event E2. An event has been detected and is stored in the storage circuit 110. After the event E, the circuit arrangement is to be armed again, so that further events can be detected. A reset signal R is applied to the ball. In contrast to an event signal E, the reset signal R may be of a defined value and may be kept at this value for a defined time. Therefore, a reset signal R may always have enough energy to toggle the storage circuit 110 from the second state S2 through the metastable state M to the first state S1. Because of the energy of the reset signal R, the metastable state M is passed quickly and the circuit arrangement will not remain in the metastable state M. Therefore, the movement from S2 to S1 is one-way, as is illustrated by the single headed arrow. Once the ball is in the first state S1, the circuit arrangement 100 is ready for detecting further events E. Diagram 800 may illustrate the first transition of the circuit arrangement.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A circuit arrangement, comprising:
a storage circuit configured to provide a first output signal and a second output signal;
an output circuit configured to receive the first output signal and the second output signal and configured to provide an output signal having one of a first signal level and a second signal level, and to switch from the first signal level to the second signal level if the difference between the first output signal and the second output signal exceeds a threshold, and
wherein the circuit arrangement is configured to hold the first output signal and the second output signal independent of a difference between the first output signal and the second output signal after the switching has been carried out.

2. The circuit arrangement of claim 1,
wherein the storage circuit is configured to provide the first output signal and the second output signal as inverses to each other.

3. The circuit arrangement of claim 2,
wherein the storage circuit comprises a plurality of cross-coupled inverters.

4. The circuit arrangement of claim 1,
wherein the output circuit comprises one of:
an inverter;
a differential amplifier; and
a comparator.

5. The circuit arrangement of claim 4,
wherein the output circuit comprises a fourth switching element of the first conductivity type and a fifth switching element of the second conductivity type coupled in series between a second output of the storage circuit and a second power node;
wherein an output of the output circuit is provided at the coupling of the fourth switching element and the fifth switching element; and
wherein a control input of the fourth switching element and a control input of the fifth switching element are both coupled to a first output of the storage circuit.

6. The circuit arrangement of claim 5,
wherein the fourth switching element comprises a fourth transistor of the first conductivity type; and
wherein the fifth switching element comprises a fifth transistor of the second conductivity type.

7. The circuit arrangement of claim 4,
wherein the output circuit comprises a differential amplifier;
wherein a first input of the differential amplifier is coupled to a first output of the storage circuit;
wherein a second input of the differential amplifier is coupled to a second output of the storage circuit;
wherein the differential amplifier is configured to switch from the first signal level to the second signal level if a difference between a voltage at the second output of the storage circuit and a voltage at the first output of the storage circuit exceeds the threshold.

8. The circuit arrangement of claim 4,
wherein the output circuit comprises a comparator,
wherein an input of the comparator is coupled to a second output of the storage circuit;
wherein the comparator is configured to switch from the first signal level to the second signal level if a voltage at the second output of the storage circuit exceeds the threshold.

9. The circuit arrangement of claim 1, further comprising:
an input circuit configured to receive a control signal, and to control the storage circuit to transfer from a first state into a second state dependent on the control signal.

10. The circuit arrangement of claim 1, further comprising:
an input circuit configured to receive a control signal and a reset signal, and to control the storage circuit to transfer from a first state into a second state dependent on the control signal, and to transfer from the second state into the first state dependent on the reset signal.

11. The circuit arrangement of claim 10,
wherein the input circuit is configured to one of:
to provide a first signal dependent on the control signal and to provide a second signal dependent on the reset signal and independent from the control signal; and
to provide a first signal dependent on the reset signal and to provide a second signal dependent on the control signal and independent from the reset signal.

12. The circuit arrangement of claim 11,
wherein the input circuit comprises a first switching element of a first conductivity type and a second switching element of a second conductivity type and a third switching element of the second conductivity type coupled in series between a first power node and a second power node, wherein the second switching element is coupled in between the first switching element and the third switching element; and
wherein a second input of the circuit is coupled to a control input of the first switching element and to a control input of the third switching element, and a first input of the circuit is coupled to a control input of the second switching element.

13. The circuit arrangement of claim 12,
wherein the first switching element comprises a first transistor of the first conductivity type;
wherein the second switching element comprises a second transistor of the second conductivity type; and
wherein the third switching element comprises a third transistor of the second conductivity type.

14. The circuit arrangement of claim 13,
wherein the first conductivity type is a p-conductivity type; and
wherein the second conductivity type is an n-conductivity type.

15. The circuit arrangement of claim 12,
wherein a voltage level of a first voltage received by the first power node is lower than a voltage level of a second voltage received by the second power node.

16. The circuit arrangement of claim 15,
wherein the first voltage is ground voltage and the second voltage is VDD voltage.

17. The circuit arrangement of claim 4, further comprising:
a load circuit coupled to the output circuit, wherein the load circuit comprises at least one of:
a buffer circuit; and
an inverter.

18. The circuit arrangement of claim 1, configured as one of:
an edge catching circuit arrangement; and
an interface between an asynchronous circuit arrangement and a synchronous circuit arrangement.

19. A method for operating an electric circuit arrangement, the method comprising:
a circuit receiving a control signal and a reset signal;
controlling a storage circuit to transfer from a first state into a second state dependent on the control signal, and to transfer from the second state into the first state dependent on the reset signal, wherein one of the reset signal and the control signal is dominant over the other of the reset signal and the control signal; and
a filter circuit suppressing propagation of a metastable state output signal provided from the storage circuit.

20. The method of claim 19, further comprising:
providing a first signal dependent on the control signal; and
providing a second signal dependent on the reset signal and independent from the control signal.

21. The method of claim 19, further comprising:
providing a first signal dependent on the reset signal; and
providing a second signal dependent on the control signal and independent from the reset signal.

* * * * *